United States Patent [19]
DiStefano

[11] 3,992,716
[45] Nov. 16, 1976

[54] METHOD AND APPARATUS FOR PROPAGATNG POTENTIAL INVERSION WELLS

[75] Inventor: Thomas Herman DiStefano, Tarrytown, N.Y.

[73] Assignee: International Business Machines Corporation, Armonk, N.Y.

[22] Filed: May 23, 1974

[21] Appl. No.: 472,783

[52] U.S. Cl. .............................. 357/24; 333/84 M
[51] Int. Cl.² ...................... H01L 29/78; H01P 3/00
[58] Field of Search .................. 357/24; 333/84 M; 315/3, 3.5, 39.51

[56] References Cited
UNITED STATES PATENTS

| | | | |
|---|---|---|---|
| 3,270,241 | 8/1966 | Vural | 315/3 |
| 3,697,786 | 10/1972 | Smith | 357/24 |
| 3,778,643 | 12/1973 | Jaffe | 357/24 |
| 3,787,823 | 1/1974 | Negishi | 357/24 |
| 3,858,232 | 12/1974 | Boyle et al. | 357/24 |

*Primary Examiner*—Edward J. Wojciechowicz
*Attorney, Agent, or Firm*—Sughrue, Rothwell, Mion, Zinn & Macpeak

[57] ABSTRACT

A slow wave stripline is disposed on the surface of a semiconductor, sandwiched between insulating layers, and covered by a ground plane, to thus form a waveguide structure. The electric field created by a r.f., electromagnetic wave propagated along the stripline establishes potential inversion wells in the surface of the semiconductor which propagate smoothly along with the wave. Minority carriers may be injected into selected wells to propagate therewith, where the presence or absence of such minority carriers represents 1 or 0 in binary notation. Practical applications include recirculating shift registers, logic arrangements, delay line memories, and optical image sensing or generating devices. In the latter two applications a matrix is developed by intersecting a meandering stripline with heavily doped strips in the semiconductor surface to maintain potential well separation between the matrix rows.

10 Claims, 14 Drawing Figures

METHOD AND APPARATUS FOR PROPAGATING POTENTIAL INVERSION WELLS

BACKGROUND OF THE INVENTION

1. Field of the Invention

This invention relates to a method and appartus for propagating potential inversion wells, together with minority carriers which may be contained therein, along the surface of a semiconductor, and to practical applications for such improved propagation techniques.

2. Description of the Prior Art

Recent research efforts have lead to the discovery that electrically isolated potential inversion wells may be established in the surface of a semiconductor, filled with minority carriers, and moved from one spot to another on the semiconductor by a surface field. See, for example, the articles in the Bell Systems Technical Journal, Apr. 1970 by Boyle and Smith at page 587 and by Amelio et al at page 593, the article in Electronics, Volume 43, No. 10, (1970) at page 112 by Altman, and the article in Scientific American, Feb. 1974, by Amelio at page 23.

The well movement or propagation technique disclosed in the above articles is a step-by-step process involving the sequential energization of digital electrodes. This is generally illustrated in FIGS. 1A – 1C, which show a p-type semiconductor 10 having an upper layer of insulation 12 on which discrete electrodes 14 are disposed, sequentially connected in three separate groups. If a positive voltage $V_2 > V_1$ is applied to the lower connecting line, as in FIG. 1A, potential inversion wells 16 will be established under the first group of electrodes. Minority carriers, in this case free electrons, may be injected into selected wells, as shown in the first and third wells for example. In effect, the $V_2$ potential repels any holes or "positive charges" adjacent the upper surface of the semiconductor 10 to thereby form a depletion region as generally indicated by contour line 18.

The movement of the potential wells 16 may be implemented by sequencing the voltage on the three connecting lines, as shown in FIGS. 1B and 1C. That is, if a voltage $V_3 > V_2$ is applied to the middle connecting line, deeper wells are established adjacent the wells created by the $V_2$ potential, and the minority carriers are attracted into the deeper wells by the stronger $V_3$ potential. When $V_3$ and $V_2$ are reduced to the $V_2$ and $V_1$ levels, respectively, the remaining wells, which have been moved over one electrode position, retain any minority carriers present.

This method of well propagation necessarily produces bumpy wells, however, particularly during the voltage sequencing transitions, and the attendant jerky well motion results in a considerable loss of minority carriers during propagation which severely limits the stage length of any device incorporating this technology.

A further problem is that due to thermal generation and junction leakage a charge domain will develop within one second of the application of a high field to the semiconductor surface, regardless of the initial presence or absence of a domain. In other words, if a voltage is applied to an electrode group to thereby establish potential wells in the semiconductor surface beneath the electrodes, the free minority carriers in the semiconductor will migrate to the wells to form charge domains within one second. To circumvent this problem the duration of the propagating potentials must be considerably less than one second, which requires very precise and accurate timing circuitry.

SUMMARY OF THE INVENTION

According to this invention the above noted disadvantages of the prior art are effectively overcome by establishing and propagating potential inversion wells in the surface of a semiconductor in a smooth and continuous manner. This is accomplished by disposing a slow wave stripline, sandwiched between insulating layers and covered by a ground plane, on the surface of a semiconductor. The resulting structure functions as a waveguide to cause the self-propagation of an r.f., electromagnetic wave along the stripline, and the electric field created by such wave serves to both establish and propagate potential inversion wells in the surface of the semiconductor.

The stripline may take the form of a meander line, a finger loaded line, etc. Such a slow wave structure is necessary to reduce the propagation velocity to a sufficiently low level for the minority carriers in the wells to keep up with the moving field. That is, the wave speed cannot be faster than the drift velocity of electrons in fields typically produced by the wave, since the electrons would otherwise not be able to keep pace and thus remain with the moving potential wells. Further, the wavelength in the guided wave structure must be short enough so that a large number of potential wells will fit on the semiconductor surface. For a well separation of $100\mu$ and a wave frequency of 30GHz, the phase velocity of the wave will be 0.01c, where c is the velocity of light. This is well within the limitations of existing dielectric materials as applied to a slow wave structure.

The propagation technique of the invention may be applied to a recirculating delay line memory or shift register, with the output from a charge domain sensor at the terminal end of the slow structure being fed back, through appropriate logic, to a domain generator at the beginning of the line. Charge domains may also be transferred from one line to another adjacent line by pulsing a nearby electrode, to thus implement logic functions.

A further application resides in using the disclosed propagation technique in a MOS optical image sensing/generating device. To implement this, a meandering stripline is sandwiched by insulation between an MOS substrate and a ground plane to form matrix columns. The matrix rows are defined by heavily doped strips in the substrate surface, which maintain potential well separtion. In the sensing mode, surface inversion charges produced at illuminated points during optical exposure are moved across the rows by an r.f., electromagnetic wave propagated along the stripline. The charges are read or sensed serially as they emerge from the ends of the rows, and the image may subsequently be reconstructed from the stored outputs of the bank of detectors.

In the generating mode, surface charges are selectively produced by a bank of generators at the beginning of each row. The charges are contained within and moved across the rows by potential wells created by an r.f., electromagnetic wave propagated along the meandering stripline. Generation continues, on a column by column basis, until the matrix is loaded, at which time the raster of charges is dumped by applying a negative pulse to the ground plane electrode. The luminescence from the dumped charges forms the optical image output.

DESCRIPTION OF THE PREFERRED EMBODIMENT

Figure 1A:
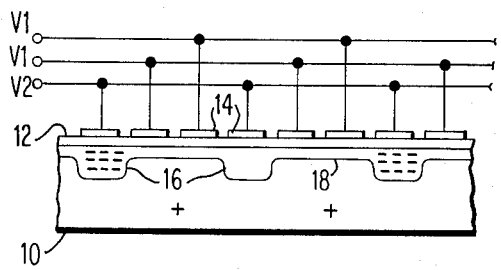
FIGS. 1A – 1C show sectional views through a semiconductor to sequentially illustrate the digital potential well propagation technique of the prior art.
Figure 1B:
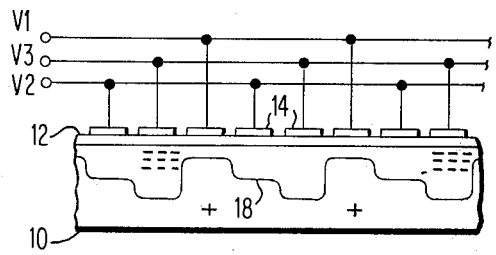
Figure 1C:
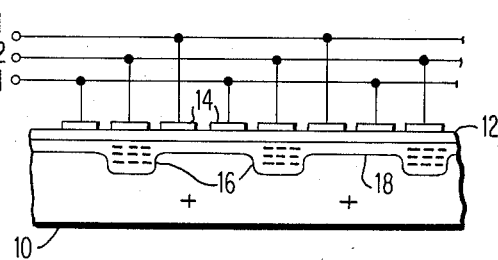
Figure 2:
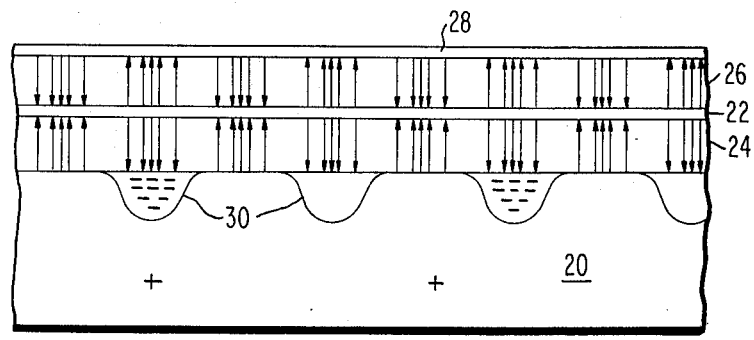
FIG. 2 shows a sectional view through a semiconductor provided with a slow wave stripline structure for implementing the potential well propagation technique of this invention.

The propagation technique of this invention may be readily understood from FIG. 2, where a slow wave stripline conductor 22, disposed over the upper surface of a p-type semiconductor 20, is sandwiched between insulating layers 24, 26 and covered by a ground plane conductor 28. The vertically arranged arrows directed toward and away from the conductor 22 indicate the electric field orientation and concentration resulting from an r.f., electromagnetic wave propagated along the conductor. Potential inversion wells 30 are formed in the semiconductor surface at intervals of one wavelength corresponding to the areas of maximum positive field strength. Charge domains, in this case free electrons, may be placed in selected wells and will propagate therewith at the phase velocity in the slow wave structure. Thus, a line of moving memory cells is formed where the presence/absence of a charge domain indicates a binary 1/0 for the memory cell corresponding to a particular potential well.

The stability of the inverted semiconductor surface may be enhanced by applying a small positive bias voltage to the conductor 22. As will also be apparent throughout, an n-type semiconductor may be used with equal facility with the potential wells then being formed at the areas of maximum negative field strength and positive charges or "holes" used to fill selected wells.

Figure 4A:
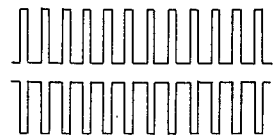
FIGS. 4A and 4B show examples of slow wave stripline configurations that may be employed with the invention.
Figure 4B:
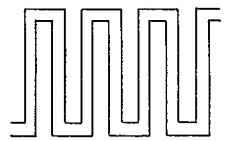

The structure of FIG. 2 may be fabricated using existing technology. The dielectric used for the insulating layers 24, 26 should have a high permittivity since this will introduce additional wave slowing. Stable, low loss dielectrics with permittivities of approximately 35 are know in the art which will do nicely. See, for example, the article by Heiman in the IEEE Transactions On Electron Devices ED-14, No. 11, Nov. 1967 at page 781. Similarly, electron beam techniques are readily available for fabricating the slow wave stripline conductor 22 in a suitable configuration to sufficiently retard or reduce the phase velocity of the r.f., electromagnetic wave to an acceptable level. Two examples of such configurations are shown in FIGS. 4A and 4B as a finger loaded line and a meander line, respectively. Additional laoding may be provided on the configuration of FIG. 4A by enlarging the tips of fingers, if necessary. Dimensionally, the transverse width of both configurations could be in the range of 10–100$\mu$, with finger separations of approximately one $\mu$ for FIG. 4A and a full cycle distance in the longitudinal direction of approximately two $\mu$ for FIG. 4B.

Figure 3:
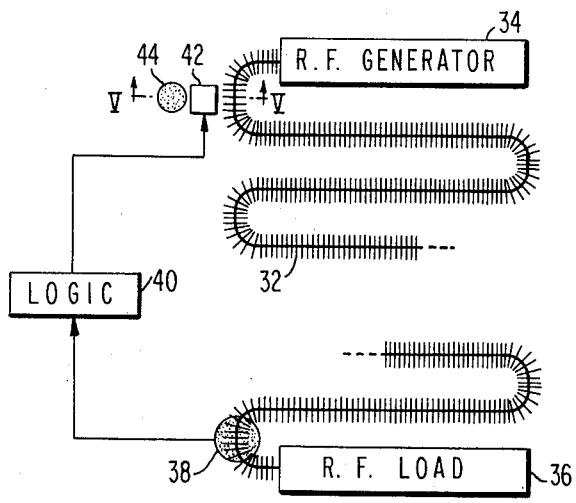
FIG. 3 shows a simplified plan view of a recirculating register or memory incorporating a slow wave stripline according to the invention.

FIG. 3 shows a recirculating register or memory including a slow wave stripline 32 energized by an r.f. signal generator 34 and terminating in an impedance matched r.f. load 36. The matched load termination is necessary to keep the standing wave ratio close to unity to thereby eliminate signal reflections and ensure that the electromagnetic wave and attendant potential wells will travel in the intended direction in the slow wave structure. The output of a charge domain sensor 38 is fed to a logic element 40 whose output in turn pulses a gate electrode 42 to generate charge domains from an electron source 44, to thereby implement controlled regeneration and recirculation. It is easily possible, with existing technology, to achieve a density of $10^5$ bits or greater in a slow wave structure as shown in FIG. 3 on a semiconductor whose surface area is $5 cm^2$. The close up stripline configuration of FIG. 3 may take any appropriate form, such as those shown in FIGS. 4A and 4B.

Figure 5A:
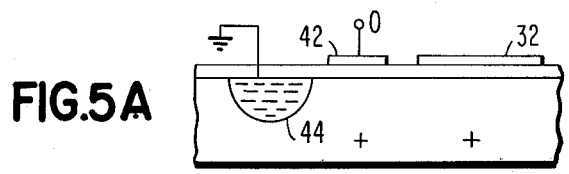
FIGS. 5A – 5D show sectional views through lines V—V of FIG. 3 to sequentially illustrate the generation and transfer of a charge domain.
Figure 5B:
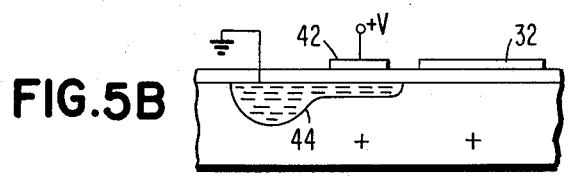
Figure 5C:
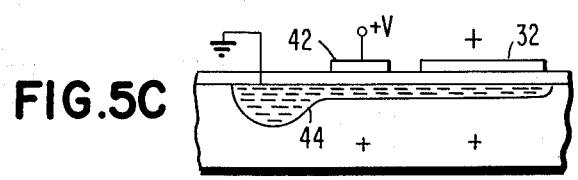
Figure 5D:
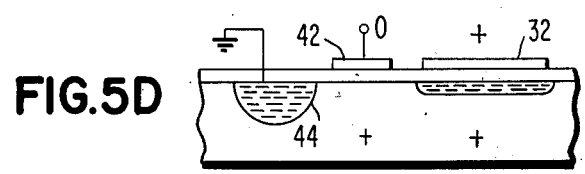

FIGS. 5A – 5D are sectional views through lines V—V in FIG. 3, and sequentially illustrate the generation of a charge domain from the electron source 44 and its gate controlled transfer to the propagation channel defined by the slow wave stripline 32. In FIG. 5A the electron source 44 takes the form of a grounded, n-doped region, and the electrons are confined therein since no signal is applied to the gate electrode 42. By placing a positive voltage on the gate 42, as shown in FIG. 5B, a negative charge is drawn off from the source 44. When the section of the stripline 32 adjacent the gate becomes positive, as in FIG. 5C, this negative charge is drawn out even farther to extend under the stripline. If the gate potential is now removed, as in FIG. 5D, the negative charge under the stripline becomes trapped there, as a new charge domain, and will thereafter propagate down the stripline in the potential well established by the r.f., electromagnetic wave.

The charge domain sensor 38 in FIG. 3 can also take the form of an n-doped region connected as one input to an amplifier in the logic element 40. The other input to the amplifier is grounded. When a charge domain propagating down the stripline 32 reaches the sensor 38 it coalesces with the electrons therein and the amplifier produces a signal. This signal may serve as an output signal, or it may be fed back to the gate electrode 42 as described above.

Figure 6:
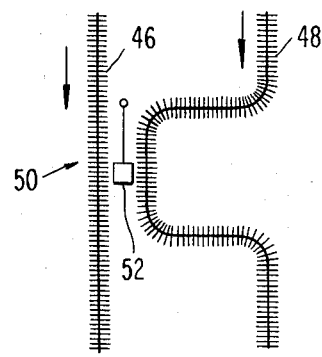
FIG. 6 shows a simplified plan view of two adjacent slow wave striplines provided with a charge domain transfer electrode.

Charge domain transfer from one slow wave stripline to another to implement, inter alia, logic functions may be accomplished by the electrode pulsing arrangement shown in FIG. 6. With two striplines 46, 48 laid closely adjacent each other at a transfer site 50 a properly timed pulse applied to electrode 52 will attract a charge domain from stripline 46 to stripline 48.

Figure 7:
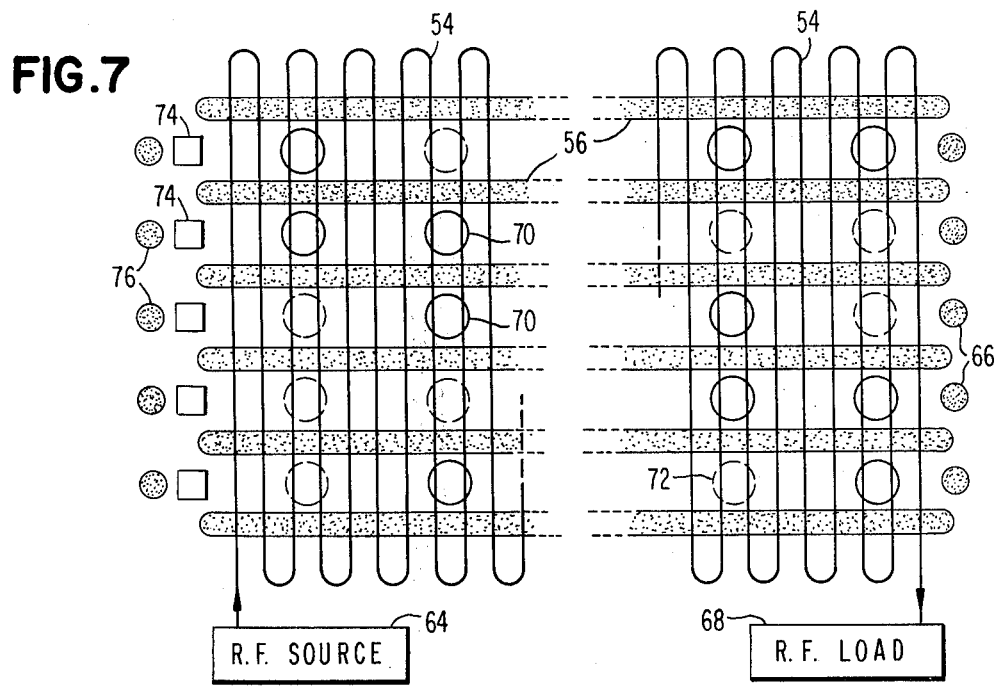
FIG. 7 shows a simplified plan view of an MOS optical image sensing/generating device embodying the principles of the invention.
Figure 8:
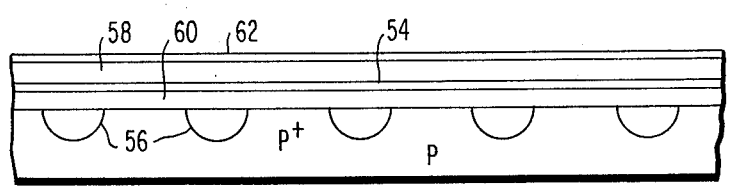
FIG. 8 shows a sectional view through the device of FIG. 7.

FIG. 7 shows an arrangement by which the charge domain technique of the invention may be used to raster surface charge on a macroscopic MOS semiconductor in an optical image sensing/generating device. The electro-optical conversion characteristics of MOS semiconductors are well known in the art, and will thus not be described herein. A stripline 54 is laid down in a zig-zag or meandering path to thereby define matrix columns, with the matrix rows being defined by heavily doped p$^+$ stripes 56 intersecting and generally transverse to the stripline 54. The stripline is sandwiched between insulating layers 58, 60 and covered by a ground plane conductor 62, as best seen in the sectional view of FIG. 8. The ground plane may take the form of a fine mesh screen pattern to allow light transmission through the sandwich.

In the optical input mode the semiconductor surface is first depleted of charge by a bias field, which may be applied to the ground plane or to the stripline. The surface is then exposed to an optical image for a sufficient time, about $10^{-3}$ seconds, for inversion charges to build up at illuminated points on the surface of the MOS semiconductor. The magnitude of such charges will be a function of the optical intensity at a given point, as is well known in the art. An r.f. signal is then applied to the stripline 54 from the source 64 to establish and propagate potential inversion wells across the rows, with the potential wells being confined to lateral or transverse movement by the heavily doped stripes 56. The potential wells carry the surface inversion charges with them for column-by-column readout by a bank of detectors 66 at the end of each row. The readout signals may be stored for subsequent processing or image reconstruction. The electromagnetic wave is terminated, as before, in matched load 68. For illustrative purposes the solid line regions 70 in FIG. 7 represent potential wells carrying optically generated surface inversion charges, while the broken line regions 72 represent empty potential wells, i.e. at areas where there was no illumination.

It should be noted that while the stripline 54 in FIG. 7 is shown as a solid line following a meandering path to thus reduce the propagation velocity across the rows, other slow wave configurations are also possible, such as an interdigital line or the finger loaded line shown in FIG. 4A. Further, although only five matrix rows have been shown in FIG. 7 in the interest of simplicity, it is obvious that any practical embodiment would have a sufficient number of rows and columns per unit distance to achieve the desired degree of optical resolution.

In the optical output or image generation mode an r.f. signal is applied to the stripline 54 to establish and propagate the necessary potential wells across the rows which carry charge domains simultaneously generated, on a column-by-column basis, by selectively pulsing the gate electrodes 74 adjacent the electron sources 76 at the beginning of each matrix row. The generation and propagation continues until the matrix is fully loaded, and a negative pulse is then applied to the ground plane conductor 62. The repulsive force from this negative pulse dumps the raster of charges by dispersing them throughout the semiconductor, and the luminescence therefrom forms the optical image output.

The circuit arrangement of FIG. 7, having both the gates 74 and sources 76 at the beginning of each row and the detectors or sensors 66 at the end of each row, may also be used as a bank of parallel, delay line memories. Each row of the matrix would form one delay line, and recirculation could be implemented by feedback arrangements between the detectors 66 and the gates 74, in the manner shown in FIG. 3.

What is claimed is:

1. A circuit arrangement for propagating potential inversion wells, together with minority carriers which may be contained therein, along the surface of a single conductivity type semiconductor charge storage medium having charge domain barrier means defining a plurality of matrix rows in which the potential inversion wells are confined to propagate, comprising:
    a. a slow-wave structure disposed closely adjacent the surface of said semiconductor charge storage medium for propagating an electromagnetic wave at a velocity lower than the maximum drift velocity of electrical charges in said semiconductor medium in electrical fields produced therein by said electromagnetic wave, potential inversion wells being established in the surface of said semiconductor medium at intervals of one wavelength of said electromagnetic wave corresponding to areas of maximum field strength, said slow-wave structure being configured as a meander line defining matrix columns generally transverse to the matrix rows in said semiconductor charge storage medium,
    b. a source of radio frequency electrical signals coupled to said slow-wave structure, and
    c. charge generator means coupled to said semiconductor medium for generating electrical charges in said semiconductor medium and controllably transferring the generated electrical charges to a propagation chanel in said semiconductor medium defined by said slow-wave structure.

2. A circuit arrangement as defined in claim 1 wherein said slow wave structure comprises a slow wave stripline, a first layer of insulation disposed between the stripline and the surface of the semiconductor, a second layer of insulation overlying the stripline and a ground plane conductor overlying the second layer of insulation, whereby the overall structure, including the semiconductor, acts as a waveguide to propagate high frequency electromagnetic waves.

3. A circuit arrangement as defined in claim 2 further comprising an impedance matched load connected to the terminal end of the stripline.

4. A circuit arrangement as defined in claim 1 wherein the semiconductor is optically active.

5. A circuit arrangement as defined in claim 1 wherein the charge domain barrier means comprises a plurality of heavily doped, parallel stripes in the surface of the semiconductor.

6. A circuit arrangement as defined in claim 4 wherein the semiconductor is an MOS semiconductor.

7. A circuit arrangement as defined in claim 4 further comprising charge domain sensing means individually disposed at the end of each matrix row.

8. A circuit arrangement as defined in claim 4 wherein said charge generator means comprises a plurality of charge domain generating means individually disposed at the beginning of each matrix row.

9. A circuit arrangement as defined in claim 1 wherein said slow-wave structure comprises a slow wave stripline and said charge generator means is operatively disposed near the beginning of said stripline, and further comprising:
    a. charge domain sensing means operatively disposed near the end of said stripline, and
    b. logic circuit means interconnecting said sensing means and said generator means to implement the controlled recirculation of charge domains by said stripline.

10. A method for propagating potential inversion wells, together with minority carriers which may be contained therein, along the surface of a single conductivity type semiconductor charge storage medium having charge domain barriers therein defining a plurality of matrix rows in which the potential inversion wells are confined to propagate, comprising:

a. propagating an electromagnetic wave at a velocity lower than the maximum drift velocity of electrical charges in said semiconductor medium in electrical fields produced therein by said electromagnetic wave, said step of propagating being performed by means of a meander line defining matrix columns generally transverse to said matrix rows and disposed closely adjacent the surface of said semiconductor medium and resulting in potential inversion wells being established in the surface of said semiconductor medium within said matrix rows at intervals of one wavelength of said electromagnetic wave corresponding to areas of maximum field strength, and b. generating electrical charges in said semiconductor medium and controllably transferring the generated electrical charges to a propagation chanel in said semiconductor medium defined by said meander line.

* * * * *